United States Patent
Li et al.

(10) Patent No.: US 7,002,283 B2
(45) Date of Patent: Feb. 21, 2006

(54) ULTRASONIC TRANSDUCER ASSEMBLY

(75) Inventors: Hing Leung Marchy Li, Hong Kong (CN); Kin Yik Hung, Hong Kong (CN); Ming Wai Kelvin Ng, Hong Kong (CN)

(73) Assignee: ASM Assembly Automation Ltd., Hong Kong (HK)

( * ) Notice: Subject to any disclaimer, the term of this patent is extended or adjusted under 35 U.S.C. 154(b) by 78 days.

(21) Appl. No.: 10/454,418

(22) Filed: Jun. 3, 2003

(65) Prior Publication Data

US 2004/0245893 A1    Dec. 9, 2004

(51) Int. Cl.
*H01L 41/08*    (2006.01)
(52) U.S. Cl. ......................... 310/325; 310/26
(58) Field of Classification Search ................ 310/26, 310/323.01, 325, 328, 323.12, 323.16, 3.12; 228/1.1
See application file for complete search history.

(56) References Cited

U.S. PATENT DOCUMENTS

| | | | | |
|---|---|---|---|---|
| 3,561,462 A | * | 2/1971 | Jugler ........................ 173/199 |
| 3,619,671 A | * | 11/1971 | Shoh ........................... 310/325 |
| 3,708,745 A | * | 1/1973 | McMaster et al. .......... 324/727 |
| 4,193,009 A | * | 3/1980 | Durley, III ............. 310/323.19 |
| 4,483,571 A | * | 11/1984 | Mishiro ................. 310/323.19 |
| 4,620,121 A | * | 10/1986 | Mishiro ................. 310/323.18 |
| 5,319,278 A | * | 6/1994 | Myohga et al. ........ 310/323.12 |
| 5,386,169 A | * | 1/1995 | Dubruque .............. 310/323.19 |
| 6,078,125 A | * | 6/2000 | Roberts ....................... 310/325 |
| 6,109,502 A | * | 8/2000 | Sato ........................... 228/1.1 |

* cited by examiner

*Primary Examiner*—Mark Budd
(74) *Attorney, Agent, or Firm*—Ostrolenk, Faber, Gerb & Soffen, LLP

(57) ABSTRACT

The invention provides an ultrasonic transducer assembly for a bonding apparatus, comprising a bonding tool mounted to an amplifying horn secured between first and second ultrasonic-generating means. A method of forming a transducer for a bonding apparatus is also provided, comprising the steps of providing an amplifying horn, securing first and second ultrasonic-generating means to the amplifying horn such that the amplifying horn is located between said first and second ultrasonic-generating means and mounting a bonding tool to the amplifying horn.

16 Claims, 5 Drawing Sheets

(a)

Degree of deviation (b)

ULTRASONIC TRANSDUCER ASSEMBLY

FIELD OF THE INVENTION

The invention relates to ultrasonic transducers, and in particular, to ultrasonic transducers for bond formation (for example, welding of fine wires and metallic joints) in semiconductor packaging equipment.

BACKGROUND AND PRIOR ART

During a semiconductor packaging process, electrical wire connections are typically made between different electronic components, for example, between a semiconductor chip and a leadframe substrate. One method is to use ultrasonic welding equipment, such as an ultrasonic transducer. An ultrasonic welding operation is carried out using a transducer that is caused to vibrate at ultrasonic frequencies. The ultrasonic energy generated by the transducer is transmitted to materials to be bonded (for example, gold or aluminum wire for wire bonding and chips with gold bumps for thermosonic flip chip bonding) through a bonding tool, which is normally in the form of a wedge, capillary or collet. The ultrasonic transducer may therefore use ultrasonic energy to attach a length of bonding wire to contact surfaces or pads of the electronic components.

FIG. 1 is a side view of a conventional ultrasonic transducer 100 of the prior art. It comprises a plurality of piezoelectric elements, such as piezoelectric ceramic rings 102 disposed in a stack, for generating ultrasonic vibrations when electricity is passed through the ceramic rings 102. The ceramic rings 102 are formed with central holes and held together in compression by back masses 104. The ceramic rings 102 are connected to control circuitry and receive input signals that cause the ceramic elements to generate ultrasonic vibrations. The ultrasonic vibrations are amplified by an elongate amplifying horn 108 at the free end of which is a bonding tool, illustrated herein in the form of a capillary 110. The capillary 110 is used to apply compressive bonding force to bonding components being welded together. A barrel 106 is provided between the ceramic rings 102 and the amplifying horn 108 to allow the transducer 100 to be mounted to a wire bonding apparatus. The transducer 100 vibrates along its axis, and its amplitude of vibration is represented by a line 112 in FIG. 1. The maximum displacement amplitude is at the free end of the amplifying horn 108 where the capillary is located.

A problem with such a conventional transducer is that the bonding force bends or deforms the transducer during bonding due to a reaction force, when the bonding tool is exerting pressure on a bonding component to be welded. This bending or deformation may result in poor coplanarity, and in turn lead to uneven distribution of bonding force exerted over different locations to be bonded.

In a particular instance, during thermosonic flip chip bonding, welding is performed on the number of gold bumps on a semiconductor chip. The bonding force could be in the order of 10 kg. The huge bonding force could deform the transducer and result in poor coplanarity on the bonding tool tip. The poor coplanarity leads to an uneven distribution of bonding force among gold bumps. A significant bonding strength difference may thus result among each bonding bump.

SUMMARY OF THE INVENTION

It is therefore an object of the invention to provide an improved transducer that avoids the aforesaid disadvantage of prior art ultrasonic transducers.

According to a first aspect of the invention, there is provided a transducer for a bonding apparatus, comprising a bonding tool mounted to an amplifying horn secured between first and second ultrasonic-generating means.

According to a second aspect of the invention, there is provided a method of forming a transducer for a bonding apparatus, comprising the steps of: providing an amplifying horn; securing first and second ultrasonic-generating means to the amplifying horn such that the amplifying horn is located between said first and second ultrasonic-generating means; and mounting a bonding tool to the amplifying horn.

It will be convenient to hereinafter describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

An example of a preferred embodiment of an ultrasonic transducer in accordance with the invention will now be described with reference to the accompanying drawings, in which.

DETAILED DESCRIPTION OF THE PREFERRED EMBODIMENT

Figure 1:
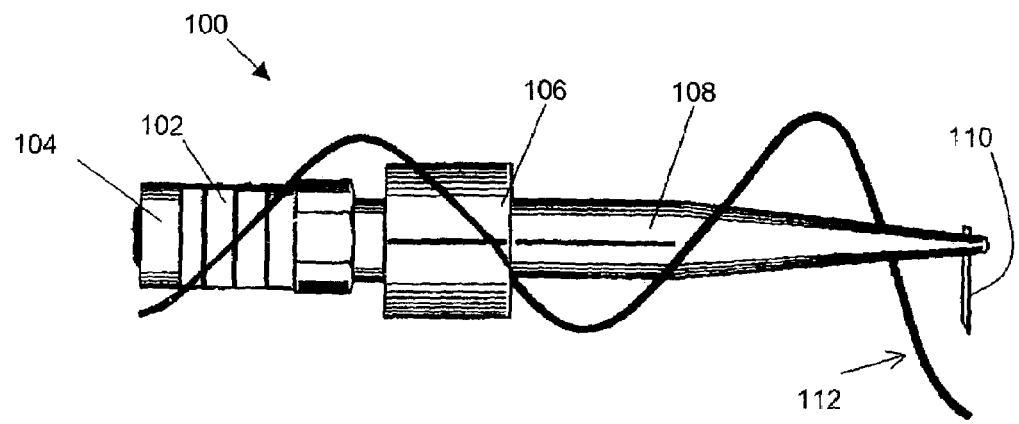
FIG. 1 is a side view of a conventional ultrasonic transducer of the prior art.
Figure 2:
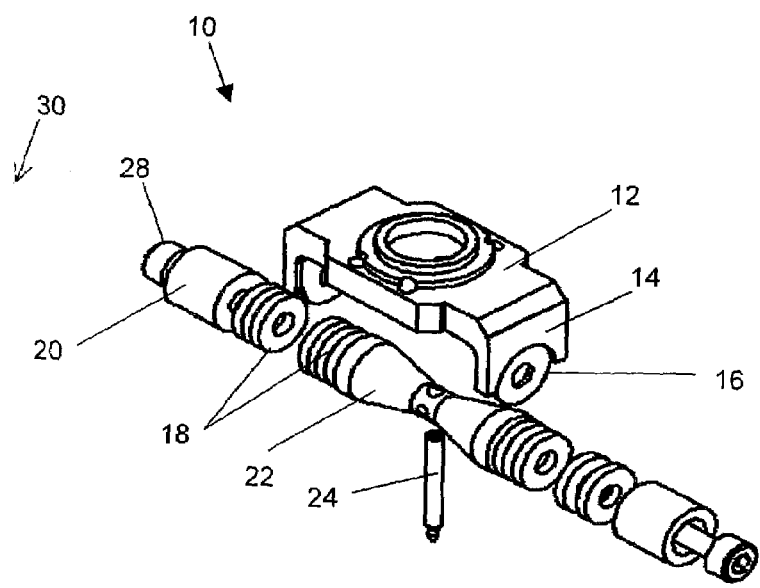
FIG. 2 is an exploded view of an ultrasonic transducer according to the preferred embodiment of the invention.

FIG. 2 is an exploded view of an ultrasonic transducer 10 according to the preferred embodiment of the invention. Ultrasonic energy is provided from first and second ultrasonic-generating means, which may be in the form of two sets of piezoelectric elements, typically made of ceramic rings 18 stacked and distributed evenly on either side of an amplifying horn 22. The amplifying horn is preferably bi-conical in shape. In this embodiment, each piezoelectric stack comprises four ceramic rings 18. The bi-conical amplifying horn 22 has a tapered geometry towards its centre which allows a maximum vibration amplitude at its centre. The transducer 10 is mountable to a bonding apparatus, such as a wire bonder machine, by way of a mounting device 12 with double flanges 14 and a mounting support 16 associated with each flange 14.

The ceramic rings 18 and mounting supports 16 are affixed to the bi-conical amplifying horn 22 by back masses 20, which are secured by fastening devices, such as tightening bolts 28, to the bi-conical amplifying horn 22. The mounting supports 16 are located at the vibration nodal points of the transducer 10. A bonding tool, for example in the form of a capillary 24, is preferably mounted substantially at the centre of the bi-conical amplify horn 22, where vibration amplitude of the transducer 10 is the highest. It should be appreciated that the transducer 10 vibrates along its axis 30.

Locating the bonding tool or capillary 24 at the centre of the two mounting supports 16 allows a good bonding coplanarity even under large compressive bond force as will be illustrated below. Further, as the bonding tool is located at the centre of the whole transducer 10, it allows a rotary moment of inertia to be reduced to a minimum when an axis passing through the longitudinal axis of the bonding tool is aligned with its axis of rotation, as in the instant design.

FIGS. 3(a) and 3(b) are comparison charts showing axial vibration profiles of a conventional ultrasonic transducer 100 as compared to the said ultrasonic transducer 10 according to the preferred embodiment of the invention. Both transducers are operating at full wavelength mode. In the drawings, the alphabet "R" represents the ability of the transducers 100, 10 to rotate about rotational axes 26, which rotational axes 26 preferably pass through the centre of the capillaries 110, 24 or their longitudinal axes. Rotation may be necessary to align the capillaries 110, 24 with respect to a bonding location. $U_x$ represents vibration amplitude. In FIG. 3(a), the capillary 110 of the conventional transducer 100 is vibrating at its maximum amplitude at one vibrational wavelength distance, $\lambda$, from an opposite end of the transducer 100. On the other hand, in FIG. 3(b), the capillary 24 of the transducer 10 according to the preferred embodiment of the invention is vibrating at its maximum amplitude, $A_{max}$, at $\lambda/2$ distance from either end of the transducer 10.

Figure 4:
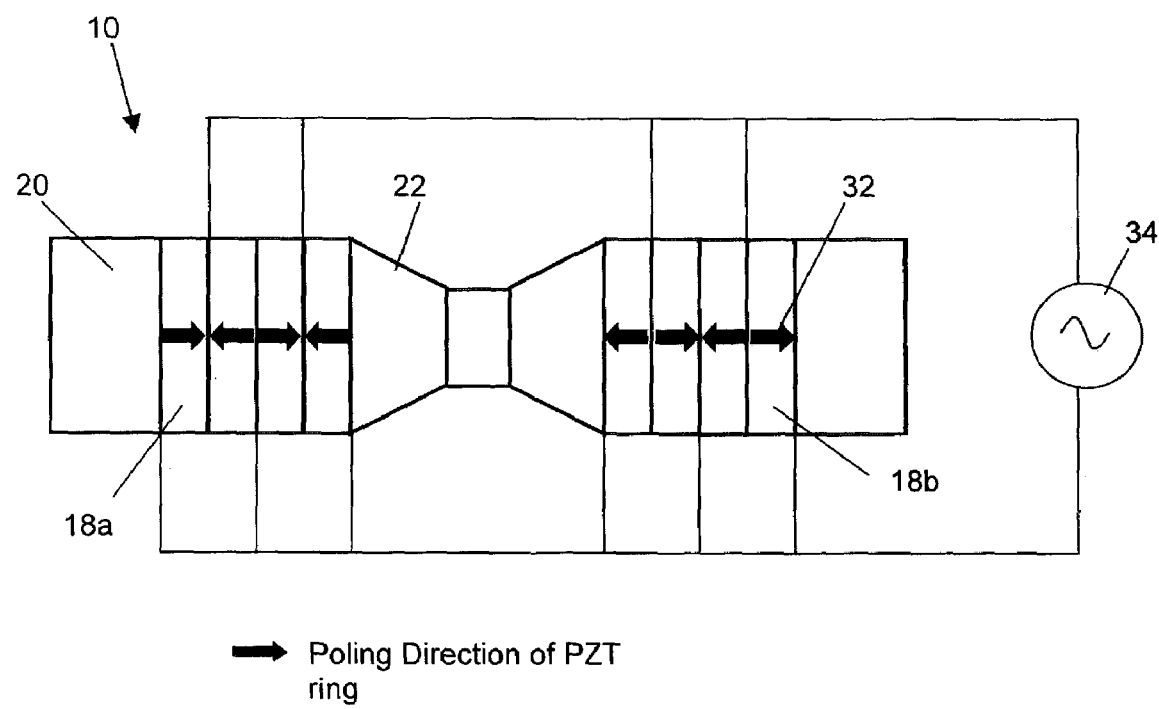
FIG. 4 is a schematic side view of the said transducer showing poling directions of its piezoelectric elements in use.

FIG. 4 is a schematic side view of the said transducer 10 showing poling directions 32 of its piezoelectric elements or ceramic rings 18 in use. The drawing shows that an electrical current source 34 delivers a current and electric fields to all the ceramic rings 18. Piezoelectric material has a poling direction. When we apply an electric field to a piezoelectric element in the poling direction, the piezoelectric element stretches horizontally in the electric field and shrinks vertically in accordance with Poisson's ratio. When we apply an electric field in the reverse direction, it shrinks horizontally in the electric field and stretches vertically.

Figure 3:
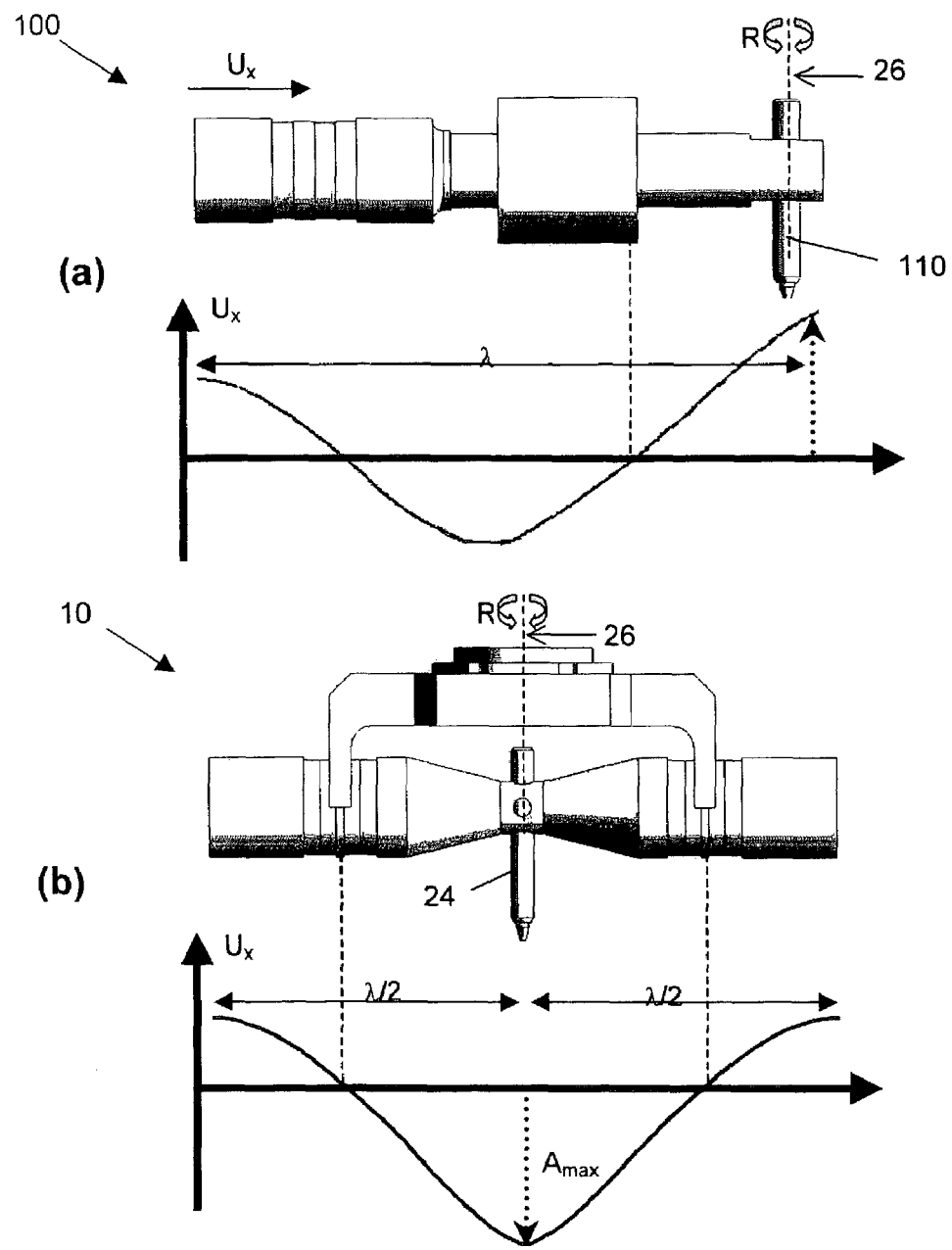
FIGS. 3(*a*) and 3(*b*) are comparison charts showing axial vibration profiles of a conventional ultrasonic transducer as compared to the said ultrasonic transducer according to the preferred embodiment of the invention.

By arranging the poling configurations or directions of the two sets of ceramic rings 18a, 18b such that they are in opposite poling directions 32, the ceramic rings 18 are synchronized such that one set of rings 18a contracts (pull) while the other 18b expands (push). That is, one set of ceramic rings 18a will contract and the other 18b will expand under a single electrical source 34. The whole transducer 10 vibrates at an ultrasonic frequency with the axial vibration profile as shown in FIG. 3. Due to the bi-conical shape of the amplifying horn 22, the tapered gemetory amplifies the vibration amplitude towards its centre.

FIGS. 5(a) and 5(b) are side view illustrations of deformations of a conventional transducer 100 and the said transducer 10 respectively experienced when applying a bond force. In the case of a conventional transducer 100 (FIG. 5(a)), when it is experiencing a bond force, the axis of its capillary 110 will shift away from the vertical so that there is a deviation between the actual bonding axis and the vertical. Such deviation will cause inaccuracy in bond force application.

In the case of the said transducer 10 according to the preferred embodiment, since its capillary 24 is equally supported on both sides by the bi-conical amplifying horn 22, the axis of the capillary 24 maintains substantially aligned with the vertical. This is even though some deformation of the bi-conical amplifying horn 22 is experienced from applying the bond force. Application of a bond force is thus more accurate and repeatable.

Figure 6:
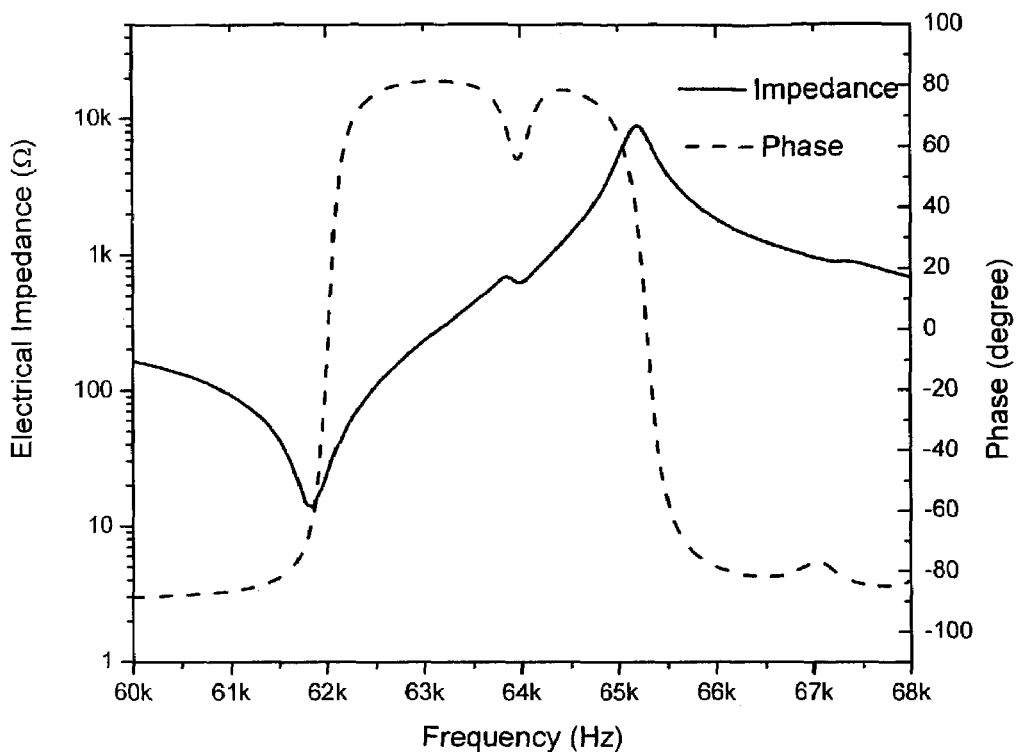
FIG. 6 shows impedance and phase characteristics of the said transducer over a selected frequency range.

FIG. 6 shows some electrical characteristics of the said transducer 10, namely its impedance and phase characteristics over a selected frequency range. A resonance frequency is reached at about 62 kHz.

Figure 7:
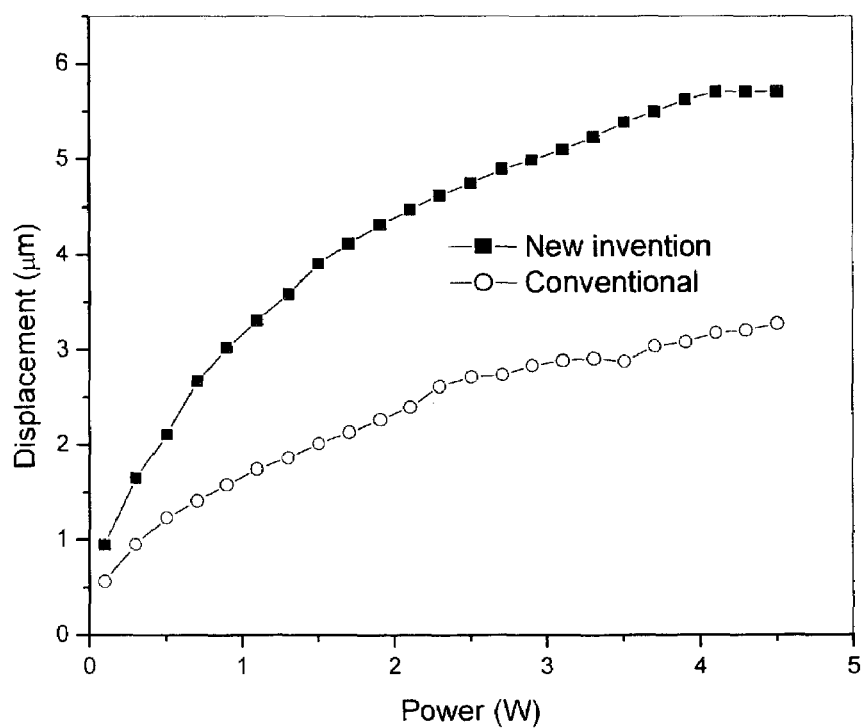
FIG. 7 is a graphical illustration of vibration displacement against power output characteristics of the said transducer at its bond tip as compared to a conventional transducer.

FIG. 7 is a graphical illustration of vibration displacement against power output characteristics of the said transducer 10 at its bond tip as compared to a conventional transducer 100. The profile of the said transducer 10 is represented by squares, whereas the profile of the conventional transducer 100 is represented by circles. It can be seen from FIG. 7 that displacement of the said transducer 10 can be significantly increased for any level of power output to the transducer 10, as compared to a conventional transducer 100. One reason for this increase is that two sets of piezoelectric element stacks 18a, 18b have been used as compared to one set for conventional transducers.

It would be appreciated that the preferred embodiment of the invention is advantageous in that the bonding coplanarity is independent of bond force. To ensure good alignment of the bonding tool, a hole for fixing the bonding tool may be drilled after the whole assembly as assembled. This assembly method may ensure a good perpendicularity of the bonding tool 24 with the mounting support 16 and simplify the transducer alignment procedure.

In a rotating bondhead mechanism, the rotational axis 26 is preferably aligned with the axis of the bonding tool 24. As the bonding tool 24 of the transducer 10 is aligned with respect to the plane of the rotational axis 26, the centre of gravity of the transducer 10 will fall in the rotational axis 26, so that the rotation inertia of the device will be reduced to a minimum.

Figure 5:
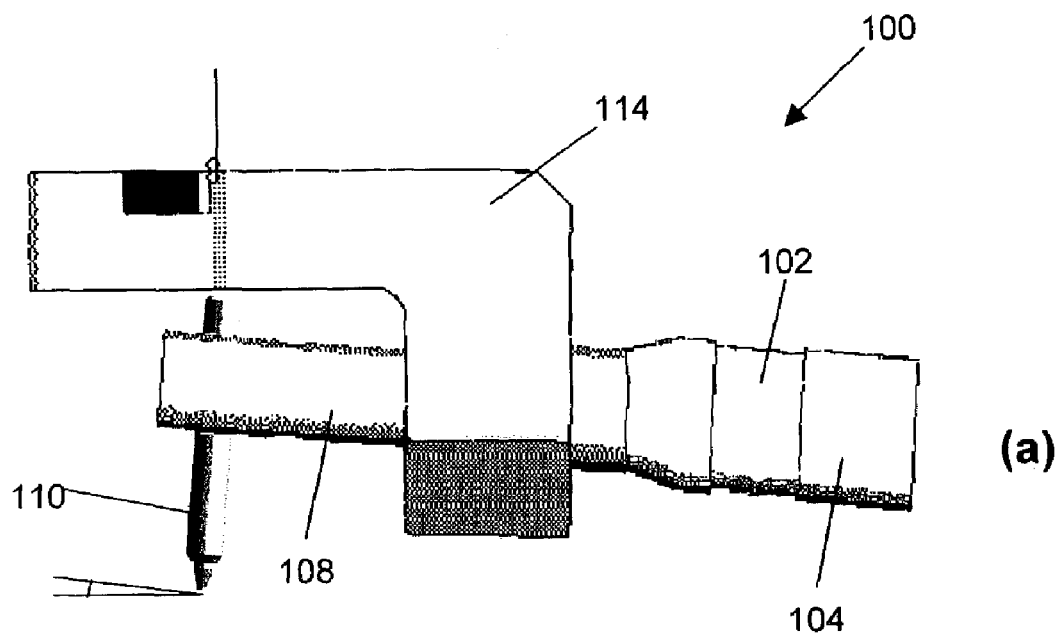
FIGS. 5(*a*) and 5(*b*) are side view illustrations of deformations of a conventional transducer and the said transducer respectively experienced when applying a bond force.
Figure 5:
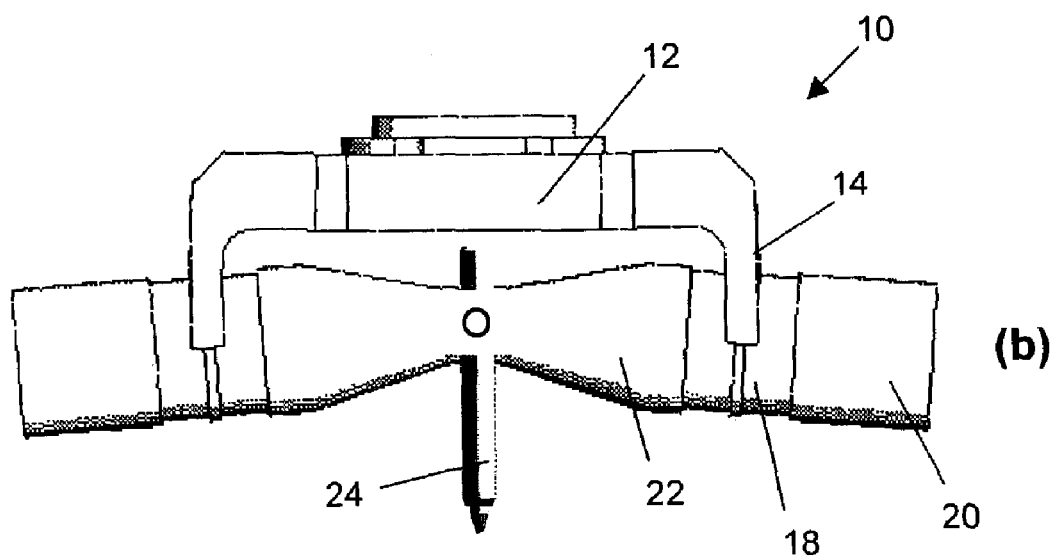

One of the main advantages of the present invention is the automatic maintenance of the coplanarity of the bonding tool with the rotary axis 26, even at high bond forces. When a conventional transducer 100 is put under a high bond force, the transducer 100 will deform and cause the bonding tool tip to be no longer parallel to the bonding target. This lack of coplanarity becomes worse as the bond force increases. The present transducer 10, however, can maintain the coplanarity of the bonding tool surface and the bonding target even under deformation as shown in FIG. 5. Thus, the volume of piezoelectric elements 18 can be increased without an increased tendency to deform. Moreover, it would be appreciated that the transducer 10 has a higher power handling capability than conventional transducers.

The invention described herein is susceptible to variations, modifications and/or additions other than those specifically described and it is to be understood that the invention includes all such variations, modifications and/or additions which fall within the spirit and scope of the above description.

The invention claimed is:

1. A transducer for a bonding apparatus, comprising a bonding tool mounted to an amplifying horn secured between first and second ultrasonic-generating means, including a mounting device comprising first and second ultrasonic mounting supports secured to the first and second ultrasonic-generating means respectively for mounting the transducer to the bonding apparatus.

2. A transducer as claimed in claim 1, wherein each of the first and second ultrasonic-generating means comprises a stack of piezoelectric elements.

3. A transducer as claimed in claim 2, wherein each stack comprises an equal number of piezoelectric elements and each mounting support is secured to each ultrasonic-generating means such that there is a piezoelectric element in contact with each side of the mounting support, and there are an equal number of piezoelectric elements on either side of the mounting support.

4. A transducer as claimed in claim 2, wherein the poling directions of said first and second stacks of piezoelectric elements are arranged whereby the first and second stacks of piezoelectric elements are excitable in opposite directions.

5. A transducer as claimed in claim 4, including a single electrical source for applying electric fields to the first and second stack of piezoelectric elements.

6. A transducer as claimed in claim 2, wherein each stack of piezoelectric elements together with the mounting support and a back mass are secured to the amplifying horn by a fastening device.

7. A transducer as claimed in claim 1, wherein the said mounting supports are secured at vibration nodal points of the transducer.

8. A transducer as claimed in claim 1, wherein the bonding tool is located substantially centrally between the first and second mounting supports.

9. A transducer as claimed in claim 1, wherein the mounting device is operable to rotate the transducer about a rotary axis.

10. A transducer as claimed in claim 9, wherein the rotary axis is substantially aligned with a longitudinal axis of the bonding tool.

11. A transducer as claimed in claim 1, wherein the amplifying horn is substantially bi-conical.

12. A transducer as claimed in claim 1, wherein the bonding tool is mounted substantially centrally between each end of the transducer.

13. A transducer as claimed in claim 12, wherein the distance between the bonding tool and each end of the transducer is equivalent to half of the vibrational wavelength of the transducer.

14. A transducer as claimed in claim 12, wherein a longitudinal axis of the bonding tool is substantially perpendicular to an axis of the transducer.

15. A transducer for a bonding apparatus, comprising a bonding tool mounted to an amplifying horn secured between first and second ultrasonic-generating means, wherein a mounting device by which the transducer is mountable to the bonding apparatus is operable to rotate the transducer about a rotary axis.

16. A transducer as claimed in claim 15, wherein the rotary axis is substantially aligned with a longitudinal axis of the bonding tool.

* * * * *